United States Patent [19]

Magdo

[11] 3,958,264

[45] May 18, 1976

[54] SPACE-CHARGE-LIMITED PHOTOTRANSISTOR

[75] Inventor: Steven Magdo, Hopewell Junction, N.Y.

[73] Assignee: International Business Machines Corporation, Armonk, N.Y.

[22] Filed: June 24, 1974

[21] Appl. No.: 482,178

[52] U.S. Cl. .............................. 357/30; 357/20; 357/21; 357/34; 357/40; 357/45; 357/48; 357/58
[51] Int. Cl.² ................ H01L 27/14; H01L 31/10
[58] Field of Search .................. 357/20, 21, 30, 34, 357/40, 45, 48, 58

[56] References Cited
UNITED STATES PATENTS

| | | | |
|---|---|---|---|
| 3,366,802 | 1/1968 | Hilbiber | 357/30 |
| 3,448,344 | 6/1969 | Schuster et al. | 357/30 |
| 3,551,761 | 12/1970 | Ruoff et al. | 357/30 |
| 3,626,825 | 12/1971 | Years | 357/30 |
| 3,706,130 | 12/1972 | Seelbach et al. | 357/48 |
| 3,714,526 | 1/1973 | Low et al. | 357/30 |
| 3,764,410 | 10/1973 | Hays | 357/20 |
| 3,794,891 | 2/1974 | Takamiya | 357/20 |
| 3,840,886 | 10/1974 | Ashar et al. | 357/21 |
| 3,855,609 | 12/1974 | Magdo et al. | 357/21 |
| 3,858,233 | 12/1974 | Miyata et al. | 357/30 |

OTHER PUBLICATIONS

J. Leff et al., "Photosensitive Transistor," IBM Tech. Discl. Bull., Vol. 7, No. 6, Nov. 1966, p. 554.

*Primary Examiner*—Andrew J. James
*Assistant Examiner*—Joseph E. Clawson, Jr.
*Attorney, Agent, or Firm*—Thomas F. Galvin

[57] ABSTRACT

A space-charge-limited (SCL) transistor is utilized as a photo-transistor. The preferred embodiments feature a base diffusion which is shallower than the standard SCL structure and a base geometry for increased light collection while maintaining the high current gain characteristic of SCL transistors.

8 Claims, 5 Drawing Figures

SPACE-CHARGE-LIMITED PHOTOTRANSISTOR

CROSS-REFERENCE TO RELATED APPLICATIONS

This application is related to copending application Ser. No. 209,233, filed Dec. 17, 1971, in the names of Kann Ashar et al for "Microampere Space-Charge-Limited Transistor", and assigned to the same assignee as the present application.

This application is also related to copending application Ser. No. 473,650, filed May 28, 1974, in the name of S. Magdo for "Space-Charge-Limited Integrated Structure", also assigned to the present assignee.

FIELD OF THE INVENTION

The present invention relates to semiconductor photodevices and more particularly to a space-charge-limited (SCL) phototransistor.

DESCRIPTION OF THE PRIOR ART

The most widely used photodetectors, either alone or in arrays, are bipolar transistors. As compared to photodiodes, phototransistors exhibit relatively high gain, in the range of 100. One disadvantage of the bipolar transistor is the fall time, which is in the range of 6 – 10 microseconds, much longer than that of a photodiode. The long fall time results from the fact that the carriers generated by the light in the floating base of the phototransistor must recombine. This recombination process is slow because the carrier lifetime is in the range of microseconds. The slow response of phototransistors has limited their application. Another problem is that their fabrication is more complicated than that of photodiodes, resulting in greater expense and lower yields, especially in photodetector arrays.

A further disadvantage of bipolar phototransistors is that their gain is too low for certain applications. For example, in scanning detector arrays for document readers, the illumination level of the light being reflected is limited. For adequate operation a gain of about 1000 is required, which is not possible with state-of-the-art transistors. This gain can be obtained by the use of an amplifier circuit associated with each phototransistor cell. This is obviously undesirable from the cost-performance standpoint. In addition, the amplifier circuit, being photosensitive itself, has to be carefully shielded.

The basic SCL transistor described in the above referenced application by Ashar et al appeared to be a candidate for photodetector application because of the high gain exhibited and the simple processing requirements as compared to standard bipolar transistors. However, the expected photo-response of the SCL transistor, in particular the fall time, was expected to be in the millisecond range due to the extremely long life time of the carrier generated in the high resistivity base region. This is much too long for most applications and would also tend to increase the cross-talk between adjacent cells of an array to an unacceptable level. Another problem with the use of SCL transistors as photodetectors is that the base region is relatively small. The base width between collector and emitter must be small to obtain high current gain. Because the SCL transistor is a lateral transistor, the base area is proportional to the base width, whereas in the vertical bipolar transistor these two dimensions can be adjusted independently. Another problem inhibiting the use of SCL transistors as photodetectors is that the current gain, which is well over 1000 at very low current levels, falls off very rapidly with increasing current, an undesirable property.

SUMMARY OF THE INVENTION

It is an object of my invention to provide a phototransistor which has a higher gain than any previously available photosensitive device.

It is yet another object of my invention to provide a photosensitive device which is capable of faster response times in conjunction with high gain.

These and other objects and advantages are achieved by using the SCL transistor as a photosensitive device. I have discovered the long lifetimes of carriers in SCL transistors do not degrade their photoresponse. In fact, both the rise time and the fall time of SCL phototransistors are shorter than that of a bipolar phototransistor. Moreover, the current gain of the SCL phototransistor is, as would be expected, over 1000.

In the preferred embodiment of the SCL phototransistor structure, the depth of regions of conductivity type opposite that of the high resistivity substrate are made shallower than their depth in the standard SCL transistor. In particular, the depth is less than the reciprocal of the absorption coefficient of the incident light. This variation virtually eliminates current gain fall-off at increased current levels.

With respect to the cross-talk problem already discussed, I have found that long lifetimes of the carriers do not increase the cross-talk between adjacent cells to an unacceptable level. Moreover, cross-talk can be reduced to the level of the bipolar phototransistor arrays by reversebiasing the isolation regions between individual SCL phototransistors.

In another embodiment of my invention, I provide a particular geometric configuration of the base which allows the base area to be increased independently from the width of the base, thereby increasing light collection while maintaining high current gain.

DESCRIPTION OF THE PREFERRED EMBODIMENT

Prior to entering into a description of the SCL phototransistor, it is thought desirable to briefly discuss the basic SCL transistor which has been described in detail in the above referenced application by Ashar et al, Ser. No. 209,233. That application is hereby incorporated by reference into the present application. The basic SCL transistor essentially comprises a pair of lateral transistors formed in overlying relationship in a high resistivity substrate of greater than 10,000 $\Omega$ - cm, preferably 30,000 $\Omega$ - cm. The lower transistor is a lateral space-charge-limited transistor while the upper transistor is a parasitic lateral bipolar transistor. At zero base bias, both transistors are cut off. As the base-emitter junction becomes increasingly forward-biased, space-charge-limited current is initiated first in the lower transistor. As the forward bias increases to higher values, bipolar transistor action is also initiated in the upper transistor.

The above referenced copending patent application of S. Magdo, Ser. No. 473,650, describes a SCL integrated circuit structure featuring optimized geometry to allow maximum packing density of the transistors in a semiconductor substrate. The widths of any two isolated regions of the same conductivity type are established in relation to the width of the region separating the isolated regions. The width of the region which separates two isolated regions having the same conductivity type as the high resistivity substrate must be greater than 0.75 times the width of either of the isolated regions. Conversely, the width of the region which separates the isolated regions having the opposite conductivity type to the substrate must be greater than 0.25 times the width of either of the isolated regions. The integrated circuit arrays described in the present application must conform to the limits described in the Magdo application, Ser. No. 473,650, which is hereby incorporated by reference in the present application.

Figure 1:
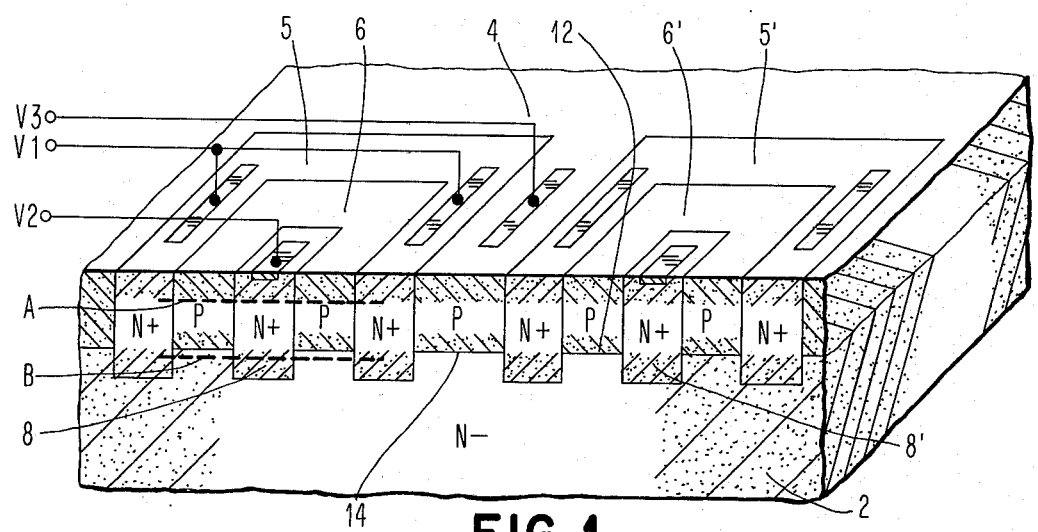
FIG. 1 is an orthogonal, cross-sectional view of a SCL phototransistor according to my invention.

The SCL phototransistor having a floating base is illustrated in FIG. 1. The structure of the phototransistor is similar to the SCL transistor described in the copending patent application of Ashar et al previously referred to. The device comprises an upper bipolar N+/P/N+ transistor along the dashed line A in the figure and a parallel-connected N+/N−/N+ transistor taken along the dashed line B. Substrate 2 has a high resistivity of at least 10,000 ohm-centimeter, preferably 30,000 ohm-centimeter. The P regions are preferably fabricated by means of a blanket diffusion through the surface of the substrate. Subsequently, the N+ regions are formed by conventional masking and diffusion techniques. The regions of the same conductivity type as the substrate, i.e., the N+ regions, are fabricated by conventional photolithographic and diffusion techniques and penetrate into the substrate deeper than the P regions.

Each of the transistors shown in FIG. 1 comprise emitter regions 8 and 8', base regions 6 and 6', and collector regions 5 and 5', respectively. The transistors are isolated from one and other by P region 4. Ohmic contacts shown on the surface of the substrate in cross-hatched lines are provided for biasing the emitter and collector regions for the transistors, as well as the isolation region. The collector contacts are connected to a source of potential $V_1$; the emitter contacts to a source of potential $V_2$; and the isolation contact to potential $V_3$. $V_1$ and $V_2$ are selected to reverse-bias collector 5 with respect to base 6. Upon the reception of incident radiation the emitter-base junction becomes forward-biased and SCL current is initiated between the emitter and collector. Potential $V_3$ is selected to reverse-bias isolation region 4. For ease of description, only one of the transistors, shown in the left-hand side of the drawing, will be discussed. However, it will be understood that the following account is equally applicable to either transistor.

The operation of the SCL phototransistors illustrated in FIG. 1 is different from that of the standard SCL transistor. When the base contact region 6, which is not tied to any potential source (floating) is illuminated, electron-hole pairs are generated simultaneously in both the P base as well as the N- base regions. The P base region is the area along line A in FIG. 1; and the N- base region is along the line B. The reverse-biased collector-base junction collects the electrons created in both the P as well as the N- base regions. The holes remaining in both of these base regions tend to forward-bias the emitter-base junctions of both the bipolar as well as the SCL transistor, thereby initiating phototransistor action.

The charge-separating action of the collector junction is very inefficient in the base of the bipolar transistor along line A. Only the electron-hole pairs generated in the depletion region of the collector junction and within a diffusion length from the depletion region are separated. The remainder, which are generated in the neutral base region of the bipolar transistor, recombine because the transport mechanism is by slow diffusion and the lifetimes are short.

In sharp contrast to this action, practically all of the electron-hole pairs generated in the high resistivity N- base region of the SCL transistor will be separated. This is due to the fact that the transport mechanism is by fast drift due to the high electric field of the collector junction which penetrates the entire high resistivity base region. Thus, the incident light is converted to current much more efficiently in the base of the SCL transistor than in the base of the bipolar transistor.

I have found that this efficiency can be further increased by decreasing the depth of the P base region 6 to a distance which is less than the reciprocal of the absorption coefficient of the incident light. For radiation in the visible and the near-infrared, the depth in substrate 2 of P region 6 should be preferably around 0.5 $\mu$meters or less. With this type of structure practically no light is absorbed in the P base region; and phototransistor action of the bipolar transistor is eliminated even at high current levels. This is a highly desirable feature, as it insures high gain in both high and low current levels. In devices which I have constructed with this dimension, current gain of around 1000 has been obtained.

The benefits resulting form the reduced depth of the base region in the SCL phototransistor is in sharp contrast to the structure of the SCL transistor described in the Ashar et al, copending application Ser. No. 209,233 and the Magdo copending application Ser. No. 473,650. In these cases electrical contact is made directly to the base of the bipolar transistor (line A), with the base of the SCL transistor (line B) being contacted indirectly. In those structures, a decrease in the depth of the P type base region would decrease the bipolar transistor action; however, it would never be eliminated completely. An adverse factor which would result from decreasing the depth of P region 6 in the standard SCL transistor is the increase of sheet resistance. This, in turn, would degrade the performance of the SCL transistor at high current levels. In the present case of the SCL phototransistor, however, increasing the sheet resistannce does not affect the performance of the lower SCL transistor because the incident light contacts it directly.

Another unexpected discovery is that the characteristic long carrier lifetimes (around 10 milliseconds in the SCL transistor) do not degrade the photo-response, in particular, the fall time. I have experimentally determined that both the rise as well as the fall times are shorter than those of a standard biplar phototransistor. Rise and fall times of 1$\mu$ and 2.7$\mu$, respectively, have been measured at 40$\mu$ a photocurrent level. Although I have not been able to definitely establish the reasons for this, one possible explanation is as follows: Most likely, the slight electric field extending from the horizontal P/N- junction 12 into the high resistivity base region of the SCL phototransistor is sufficient to remove holes from the high resistivity N- base region by a drift mechanism. They are then attracted into the much more heavily doped P type base region where recombination takes place. Because the parasitic upper bipolar transistor is never turned on if the depth of the P region is sufficiently shallow, the recombination time of holes in the P type region 6 does not affect the fall time of the SCL phototransistor. As previously mentioned, this result could not be expected because the electric field in the high resistivity base region is low due to the fact that the horizontal P-N- junction is somewhat forward-biased during operation.

The hole-removing action of the horizontal P/N-junction 14 also reduces cross-talk between adjacent transistors. In this type of device cross-talk is defined as the percentage of electrons generated in the active base region of the illuminated device which is collected by the collector of an unilluminated adjacent device. By reverse-biasing the isolation region, separating adjacent devices, with respect to the emitters of the devices as shown in FIG. 1 cross-talk can be further reduced. Reverse-biasing increases the hole collection efficiency of the isolation region.

Metal shields placed over the isolation regions can also be used to block the light to avoid electron-hole generation in the isolation regions themselves.

Photosensitivity can be greatly increased and dark current reduced if the effective area of the light-collecting base region of the phototransistors is as large as possible. However, the base width between the base-collector and base-emitter junctions must be as narrow as possible in order to assure high current gain and fast switching. These seemingly contradictory structural requirements are achieved by the geometric configurations illustrated in FIGS. 2 and 3.

In both figures the base-emitter junction is substantially rectangular, and is circumscribed by the collector-base junction. The portions of the latter which are coextensive with the sides of the base-emitter junction are substantially parallel thereto, being separated by a constant-width base region. However, the portions of the base-collector junction which are not coextensive with the base-emitter junction may be designed to be as far removed from the emitter-base junction as desired. This extension of the perimeter of the base-collector function thereby increases the effective base area.

Figure 2:
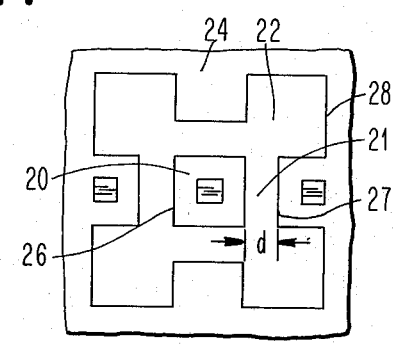

In FIG. 2 the emitter, base and collector regions of the SCL phototransistor are denoted by numerals 20, 21 and 24, respectively. Those portions of collector-base junction 27 which are coextensive with base-emitter junction 26 are separated therefrom by a constant distance 'd'. However, those portions 28 of collector-base junction 27 not coextensive with junction 26 are extended to provide additional regions 22 for the base.

Figure 3:
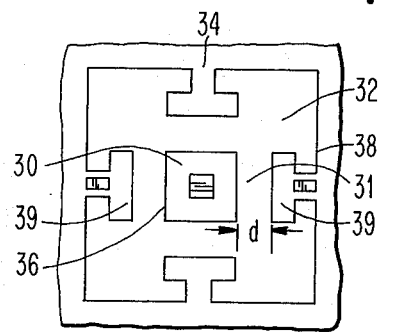
FIGS. 2 and 3 are surface views of SCL phototransistors having increased base areas for efficient light collection.

In FIG. 3, the effective area of base region 31 is further increased by reducing the area of collector 34. The geometric configuration of base-collector junction 38 is substantially rectangular but with four T-shaped inset regions 39. Regions 39 maintain the base width at the desired distance 'd'.

Figure 4:
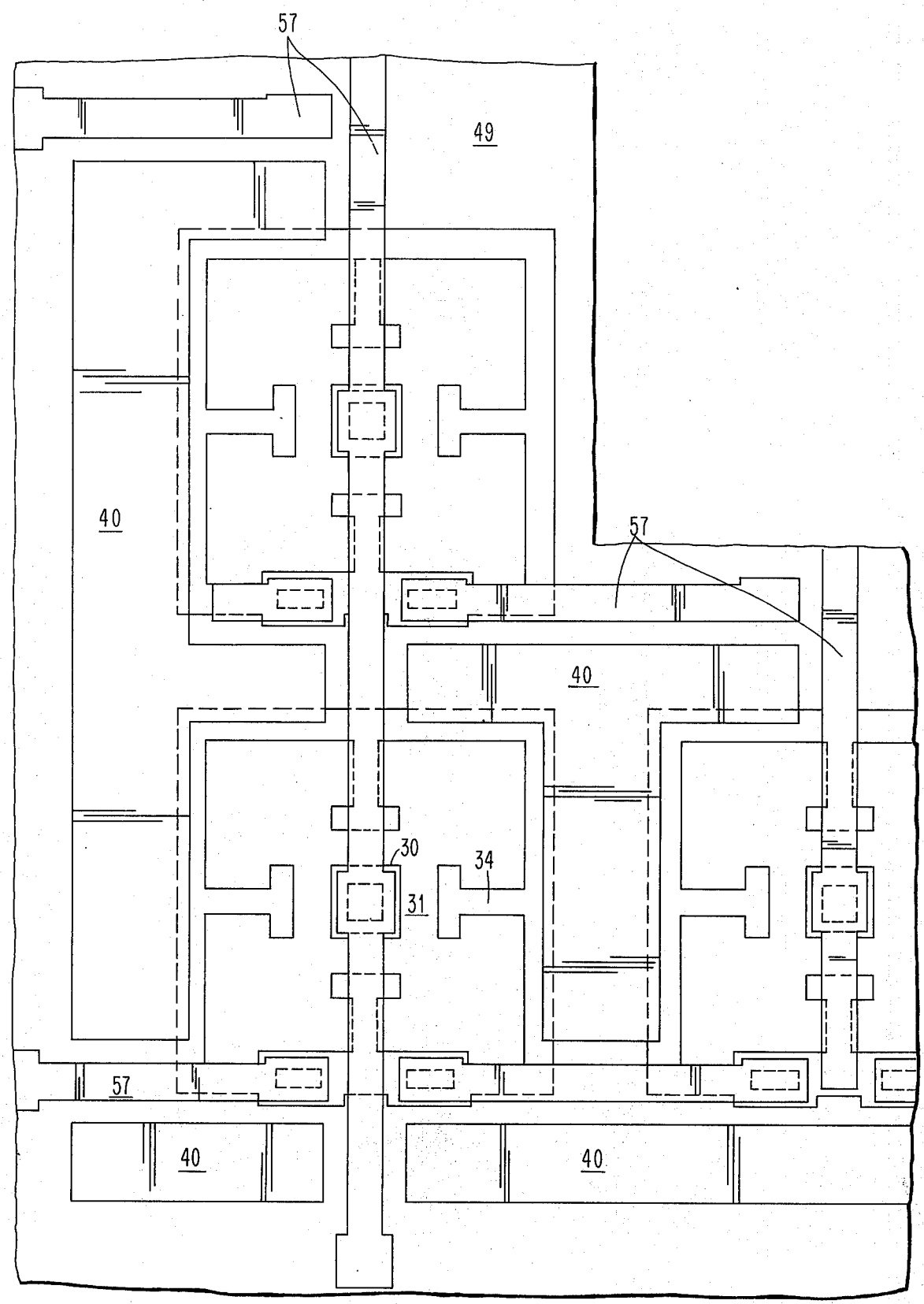

FIG. 4 is a surface view of an integrated circuit array of SCL phototransistors illustrated in FIG. 3. Metal shields 40 are placed atop the isolation regions between the transistors, and insulated therefrom by appropriate insulating material, to avoid electron-hole generation.

The isolation region 49 is reverse-biased through a contact (not shown) to reduce cross-talk. X—Y addressing is accomplished by the metallic interconnecting lines 57.

Figure 5:
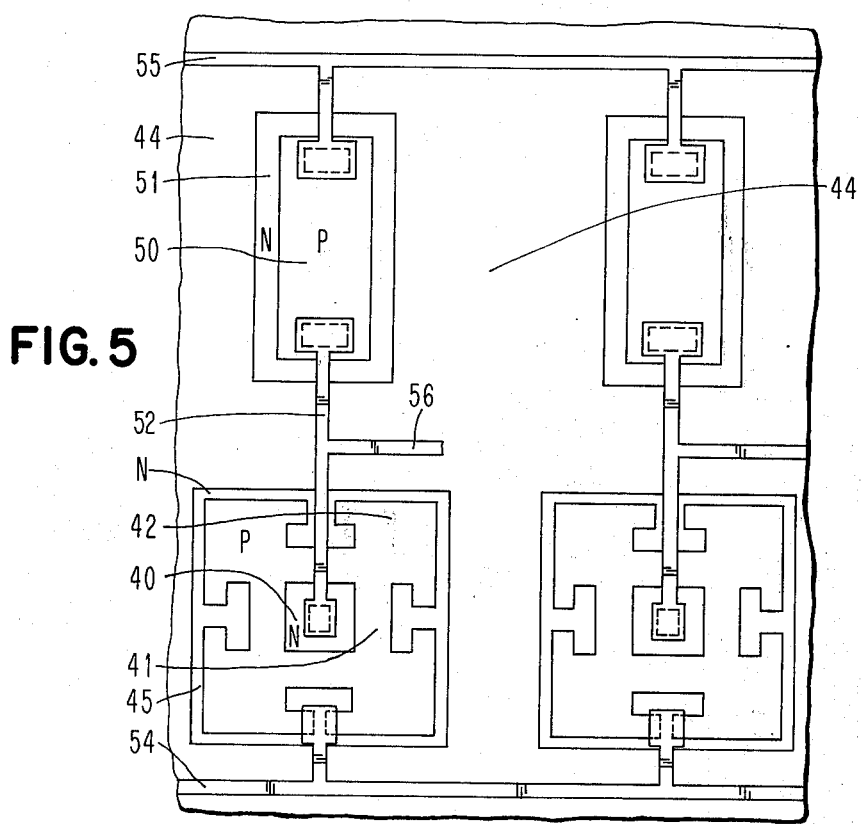
FIGS. 4 and 5 are surface views of SCL phototransistors in integrated circuit arrays.

FIG. 5 illustrates a SCL phototransistor array having parallel outputs which may be used as a scanning array for applications such as document reading. The potential to emitter 40 is supplied from supply line 55 through a P type resistor 50 and line 52. Line 56 serves as the output from the transistor. Supply line 54 provides potential to the collector contacts of the SCL phototransistors. Depending on the circuit operation desired, resistor 50 could also be connected to collector 45.

While may invention has been particularly described with reference to the preferred embodiments thereof, it will be understood by those skilled in the art that the foregoing and other changes in form and detail may be made therein without departing from the spirit and scope of the invention.

I claim:

1. A radiant energy responsive device comprising: a space-charge-limited transistor including a high resistivity substrate of a first conductivity type of at least 10,000 ohm-centimeter semiconductor material, a base zone of a second conductivity type and collector and emitter zones of said first conductivity type extending from one surface of said substrate into the interior thereof;

the depth of said base zone within said substrate being less than the reciprocal of the absorption coefficient of the incident radiant energy;

means for reverse-biasing said collector with respect to said base;

whereby upon the incidence of radiant energy on said device, space-charge-limited current is generated between the emitter and collector of said device.

2. A device as in claim 1 wherein:

the base-emitter junction of said transistor at the surface of said substrate is substantially rectangular and is circumscribed by the collector-base junction;

the perimeter of the collector-base junction includes:

four sides, each of which is parallel and equilateral with respect to a respective side of said emitter-base junction; and other sides which are further removed from said emitter-base junction than said four sides thereby resulting in an extended base zone.

3. A space-charge-limited transistor adapted to convert radiation incident at its surface into space-charge-limited current comprising:

a high resistivity substrate of a first conductivity type of at least 10,000 ohm-centimeter semiconductor material;

collector and emitter zones of said first conductivity type extending from one surface of said substrate into the interior thereof;

a base zone of a second conductivity type extending from said one surface to a depth which is less than the reciprocal of the absorption coefficient of the incident radiant energy;

the base-emitter junction of said transistor at the surface of said substrate being substantially rectangular and circumscribed by the collector-base junction;

the perimeter of the collector-base junction including:

four sides, each of which is parallel and equilateral with respect to a respective side of said emitter-base junction; and other sides which are further removed from said emitter-base junction than said four sides thereby resulting in an extended base zone for the reception of radiant energy.

4. An integrated circuit array of radiant-energy-responsive devices comprising:
- a plurality of space-charge-limited transistors fabricated in a high resistivity substrate of a first conductivity type of at least 10,000 ohm-centimeter semiconductor material, each transistor including a base zone of a second conductivity type and collector and emitter zones of said first conductivity type extending from one surface of said substrate into the interior thereof;
- the depth of said base zones within said substrate being less than the reciprocal of the absorption coefficient of the incident radiant energy;
- means for reverse-biasing the collector of each said transistor with respect to its base; and
- an isolation region of said second conductivity type located between said transistors.

5. An integrated circuit array as in claim 4 further comprising:
- means for reverse-biasing said isolation region with respect to said collectors, thereby reducing crosstalk between adjacent transistors.

6. An integrated circuit array as in claim 4 further comprising:
- metallic shields disposed over selected areas of said isolation region for blocking the reception of radiation in said region.

7. An integrated circuit array as in claim 4 wherein:
- the base-emitter junction of each said transistor at the surface of said substrate is substantially rectangular and is circumscribed by the collector-base junction;
- the perimeter of the collector-base junction includes:
- four sides, each of which is parallel and equilateral with respect to a respective side of said emitter-base junction; and
- other sides which are further removed from said emitter-base junction than said four sides
- thereby resulting in an extended base zone for each transistor.

8. An integrated circuit array as in claim 7 further comprising:
- metallic shields disposed over selected areas of said isolation region for blocking the reception of radiation in said region.

* * * * *